(12) United States Patent
Nunan et al.

(10) Patent No.: US 9,773,921 B2
(45) Date of Patent: Sep. 26, 2017

(54) COMBO AMORPHOUS AND LTPS TRANSISTORS

(71) Applicant: Applied Materials, Inc., Santa Clara, CA (US)

(72) Inventors: Peter Nunan, Monte Sereno, CA (US); Xuena Zhang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/278,510

(22) Filed: Sep. 28, 2016

(65) Prior Publication Data

US 2017/0125606 A1     May 4, 2017

Related U.S. Application Data

(60) Provisional application No. 62/248,957, filed on Oct. 30, 2015.

(51) Int. Cl.
| | |
|---|---|
| *H01L 29/78* | (2006.01) |
| *H01L 21/02* | (2006.01) |
| *H01L 29/786* | (2006.01) |
| *H01L 29/66* | (2006.01) |
| *H01L 21/324* | (2006.01) |
| *H01L 21/266* | (2006.01) |
| *H01L 21/268* | (2006.01) |

(52) U.S. Cl.
CPC .. *H01L 29/78696* (2013.01); *H01L 21/02532* (2013.01); *H01L 21/02592* (2013.01); *H01L 21/02667* (2013.01); *H01L 21/266* (2013.01); *H01L 21/268* (2013.01); *H01L 21/324* (2013.01); *H01L 29/66765* (2013.01); *H01L 29/78669* (2013.01); *H01L 29/78678* (2013.01)

(58) Field of Classification Search
CPC ... H01L 29/78; H01L 29/786; H01L 29/7869; H01L 29/78696; H01L 29/7867; H01L 29/78678; H01L 29/66; H01L 29/667; H01L 29/6676; H01L 29/66765; H01L 29/7866; H01L 29/78669; H01L 21/02; H01L 21/025; H01L 21/0253; H01L 21/0259; H01L 21/02532; H01L 21/02592; H01L 21/026; H01L 21/0266; H01L 21/02667; H01L 21/26; H01L 21/266; H01L 21/268; H01L 21/32; H01L 21/324
USPC .......................................................... 257/57
See application file for complete search history.

(56) References Cited

U.S. PATENT DOCUMENTS

| | | | |
|---|---|---|---|
| 7,109,075 B2 | 9/2006 | Yeh et al. | |
| 7,338,845 B2 | 3/2008 | Kuo | |
| 2003/0148565 A1* | 8/2003 | Yamanaka | .......... H01L 21/2026 438/200 |
| 2005/0218403 A1 | 10/2005 | Kuo | |

\* cited by examiner

*Primary Examiner* — Monica D Harrison
(74) *Attorney, Agent, or Firm* — Patterson + Sheridan LLP

(57) ABSTRACT

The present disclosure generally relates to an improved large area substrate thin film transistor device, and method of fabrication thereof. More specifically, amorphous and LTPS transistors are formed by first forming an amorphous silicon layer, annealing the amorphous silicon layer to form polycrystalline silicon, depositing a masking layer over a first portion of the polycrystalline silicon layer, implanting a second portion of the polycrystalline silicon layer with an amorphizing species, and removing the masking layer.

20 Claims, 5 Drawing Sheets

COMBO AMORPHOUS AND LTPS TRANSISTORS

CROSS-REFERENCE TO RELATED APPLICATIONS

This application claims benefit of U.S. Provisional Patent Application No. 62/248,957, filed Oct. 30, 2015, which is herein incorporated by reference.

BACKGROUND

Field

Embodiments of the present disclosure generally relate to an improved large area substrate thin film transistor device, and method of fabrication thereof. More specifically, embodiments of the present disclosure generally relate to a large area substrate amorphous and LTPS thin film transistor device.

Description of the Related Art

OLED (Organic Light Emitting Diode) & Liquid Crystal Displays (LCDs) are frequently used for flat panel displays. Liquid crystal displays generally contain two glass substrates joined together with a layer of liquid crystal material sandwiched therebetween. The LCD display utilizes light emitting diodes for back lighting. OLED displays utilize an array of LTPS transistors to drive current through deposited Organic Light Emitting material. As the resolution requirements for LCDs & OLEDs increase, it has become desirable to fabricate transistors with good drive current and low off state leakage current. In a modern display panel, more than 1,000,000 pixels may be present. At least the same number of thin film transistors (TFTs) is formed on the glass substrate so that each pixel can be switched between an energized and de-energized state relative to the other pixels disposed on the substrate. Silicon containing materials have been used to form thin film amorphous silicon layers. These layers are then converted to Poly Silicon using Excimer Laser Annealing. This polycrystalline silicon (polysilicon) is referred to as low temperature polysilicon (LTPS) TFT and as an element utilized in forming a transistor used as a switch to turn pixels on and off. Unlike amorphous silicon TFTs, LTPS TFTs exhibit good switching properties. However, the problem with LTPS is something known as the floating body effect, which affects the transistor device characteristics. When a charge accumulates, the LTPS transistor exhibits similar results to that of silicon on insulator, that is the body of the device tends to float up due to hot carrier scattering, making the pixels harder and harder to switch off causing the LTPS transistors to have poor off state leakage current. To address this issue, it has been proposed to combine the use of low temperature polycrystalline silicon and metal oxide. However, the combination of LTPS and metal oxide would be extremely difficult and costly.

Therefore, there is a need in the art for an improved display device and method of fabrication thereof.

SUMMARY

Embodiments of the present disclosure generally relate to an improved large area substrate thin film transistor device, and method of fabrication thereof. More specifically, embodiments of the present disclosure generally relate to a large area substrate amorphous and LTPS thin film transistor device.

In one embodiment, a method of forming a thin film transistor on a large area substrate is disclosed. The method includes forming a film, which includes a nitride layer, an oxide layer, and an amorphous silicon layer. The method further includes annealing the film, depositing a masking layer over a first portion of the film, implanting a second portion of the film with an amorphizing species and removing the masking layer.

In another embodiment, a method of forming a thin film transistor on a large area substrate is disclosed. The method includes forming a polycrystalline silicon layer by depositing an amorphous silicon layer over a substrate and annealing the amorphous silicon layer. The method further includes depositing a masking layer. A first portion of the polycrystalline silicon layer is covered by the masking layer and a second portion of the polycrystalline silicon layer is exposed. The method further includes implanting the second portion of the polycrystalline silicon layer with an amorphizing species and then removing the masking layer.

In yet another embodiment, a large area substrate thin film transistor device is disclosed. The device includes a first nitride layer, a second oxide layer, and a third layer. The third layer comprises a first portion and a second portion. The first portion comprises polycrystalline silicon and the second portion comprises an amorphous silicon.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to an improved large area substrate thin film transistor device, and method of fabrication thereof. More specifically, amorphous and LTPS transistors are formed by first forming an amorphous silicon layer, annealing the amorphous silicon layer to form polycrystalline silicon, depositing a masking layer over a first portion of the polycrystalline silicon layer, implanting a second portion of the polycrystalline silicon layer with an amorphizing species, and removing the masking layer.

Figure 1:
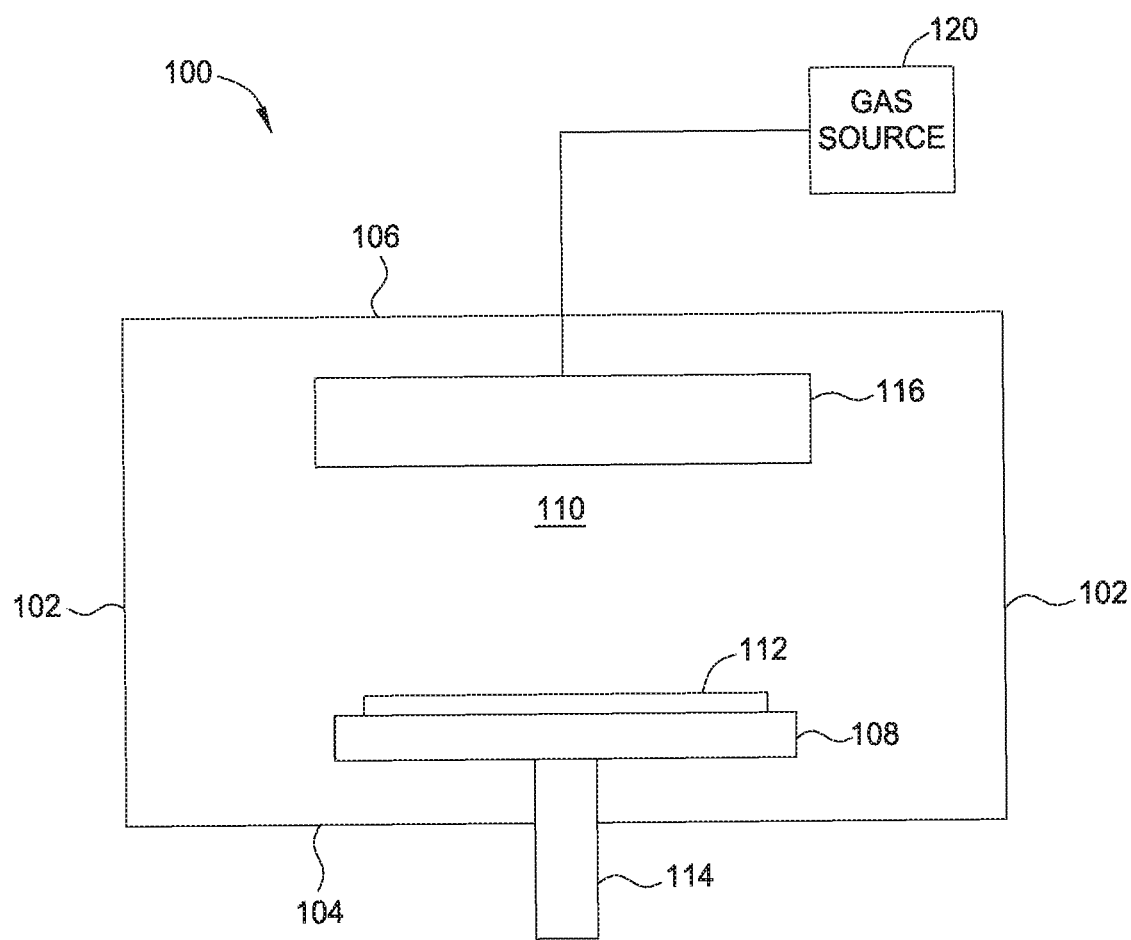
FIG. 1 is a schematic view of a chamber that may be used to form an amorphous silicon layer according to one embodiment described herein.

FIG. 1 is a schematic view of a chamber 100 that may be used to form an amorphous silicon layer according to one embodiment described herein. The chamber 100 generally includes walls 102, a bottom 104 and a lid 106. The chamber 100 also includes a substrate support 108 and an implanter 116, which define the process volume 110. A substrate 112 may be transferred into and out of the chamber 100. A pedestal stem 114 may couple the substrate support 108 to a lift system, which raises and lowers the substrate support 108 between substrate transfer and processing positions. A gas source 120 is coupled to the lid 106 to provide gas through the lid 106. The gas source 120 is also coupled to the implanter 116. The implanter 116 may be used to change the conductivity type of silicon, to anneal or harden a device, or to implant the device with a chemical element or compound, such as an amorphizing species.

Figure 2:
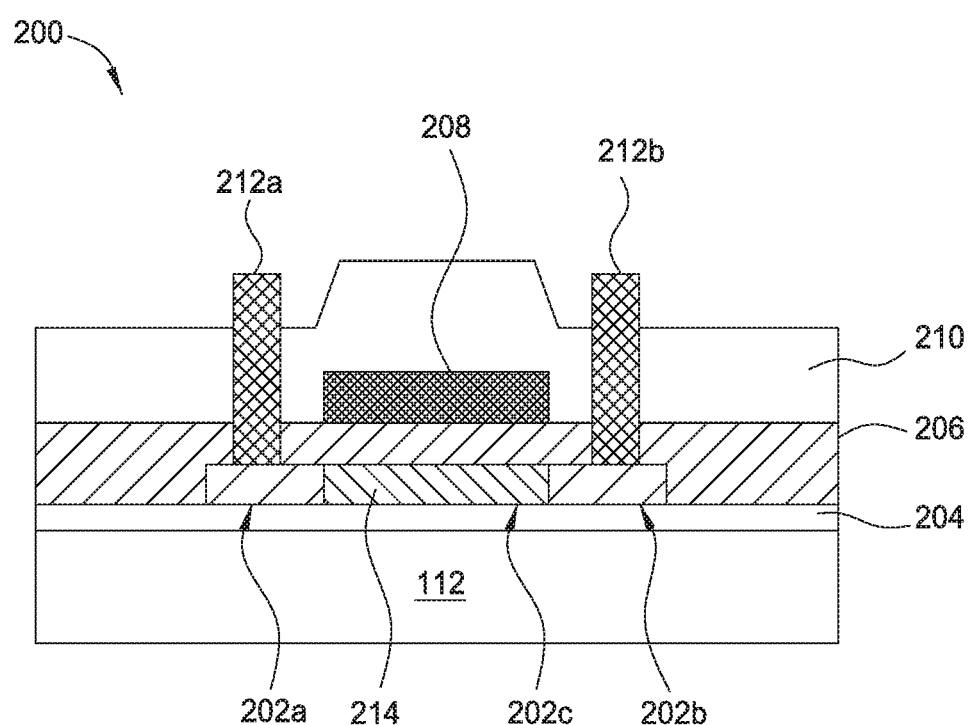
FIG. 2 is a sectional view of an LTPS TFT device structure.

FIG. 2 is a sectional view of a LTPS TFT device 200 structure. The device 200 includes a source region 202a, channel region 202c, and drain region 202b formed on an optically transparent substrate 112 with or without an optional dielectric layer 204 disposed thereon. The source region 202a, channel region 202c, and drain region 202b are generally formed from an initially deposited amorphous silicon layer that is later thermal processed (e.g., annealed) to form a polycrystalline silicon layer. The source, channel, and drain regions 202a, 202c, and 202b can be formed by patterning areas on the optically transparent substrate 112 and ion doping the deposited initial amorphous silicon layer, which is then thermally processed to form the polycrystalline silicon layer. A gate dielectric layer 206 is then deposited on top of the deposited polycrystalline silicon layer(s) to isolate a gate electrode 208 from the channel region 202c, source region 202a, and drain region 202b. The gate electrode 208 is formed on top of the gate dielectric layer 206. An insulating layer 210 is formed over the gate dielectric layer 206 and gate electrode 208. Device connections 212a and 212b are then made through the insulating layer 210 to allow control of the device 200.

The performance of a device 200 is dependent on the quality of the films that are deposited to form the structure. The key performance elements of the device 200 are the qualities of the polycrystalline silicon channel layer 214, the gate dielectric layer 206, and the polycrystalline silicon channel layer/gate dielectric layer interface. The polycrystalline silicon channel layer 214 is initially formed as an amorphous silicon layer and then heated up to about 450 degrees Celsius or greater to perform a dehydrogenation process to remove hydrogen from the amorphous silicon layer. After the dehydrogenation process, a laser annealing process may be performed to transform the amorphous silicon layer into a polycrystalline silicon layer. Subsequently, a gate insulator or other suitable layers may be formed thereon to complete the device 200 structure. The gate insulating layer 210 may comprise high k oxide, oxynitride, nitridation of oxide, or a mixture of high k+SiON, SiN or Si.

An excess amount of hydrogen elements in the amorphous silicon layer may penetrate into the adjacent gate dielectric layer 206 or other adjacent layers, prior to forming the polycrystalline silicon channel layer 214, resulting in current leakage or other types of device failure.

Figure 3:
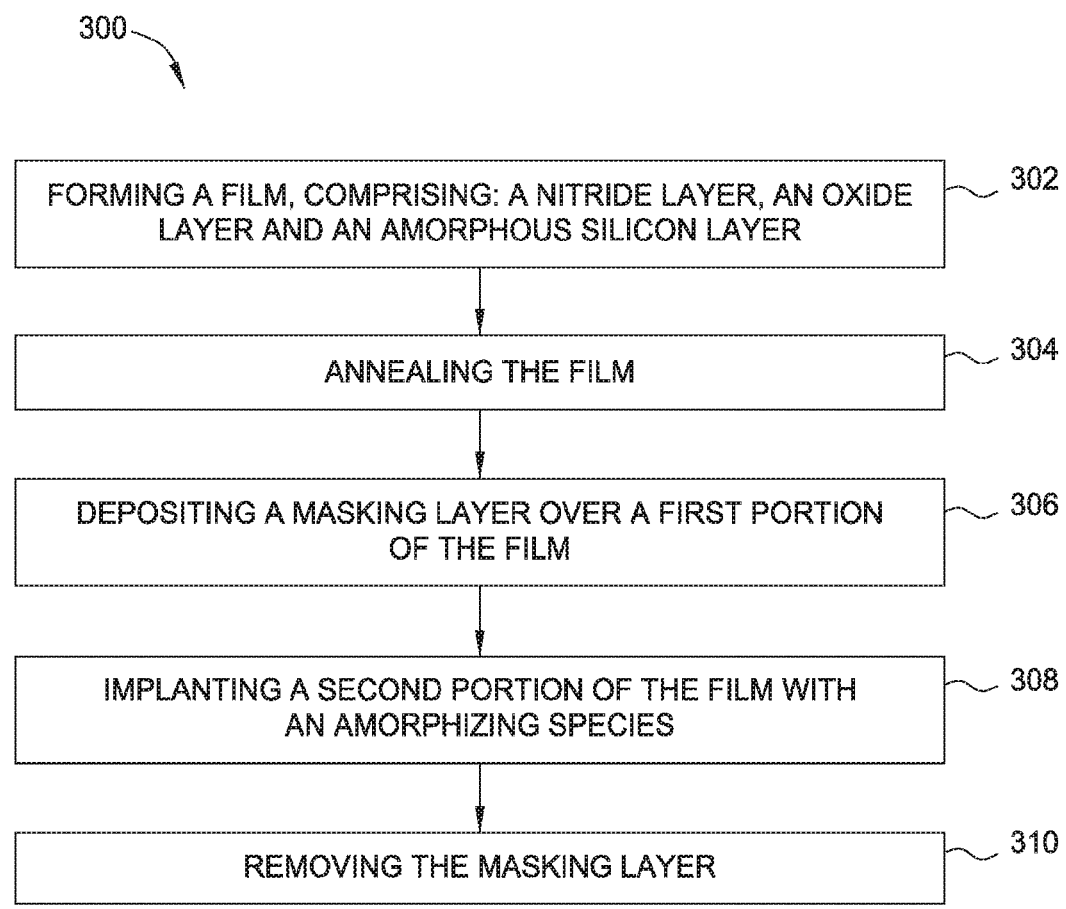
FIG. 3 is a flow chart of a method of fabrication of an improved large area substrate thin film transistor device according to one embodiment described herein.

FIG. 3 is a flow chart of a method 300 of fabrication of an improved large area substrate thin film transistor device according to one embodiment described herein. FIGS. 4A-4E depict an embodiment of a device structure having an amorphous silicon layer shown in stages of a sequence for transforming the amorphous silicon layer into a polycrystalline silicon layer and then transforming portions of the polycrystalline silicon layer back into amorphous silicon according to one embodiment described herein.

Figure 4A:
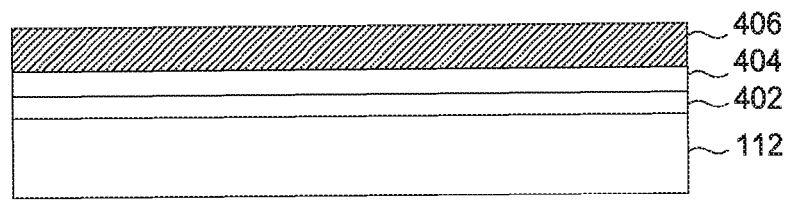
FIGS. 4A-4E depict an embodiment of a large area substrate thin film transistor device structure having an amorphous silicon layer shown in stages of a sequence for transforming the amorphous silicon layer into a polycrystalline silicon layer and then transforming portions of the polycrystalline silicon layer back into amorphous silicon according to one embodiment described herein.
Figure 4B:
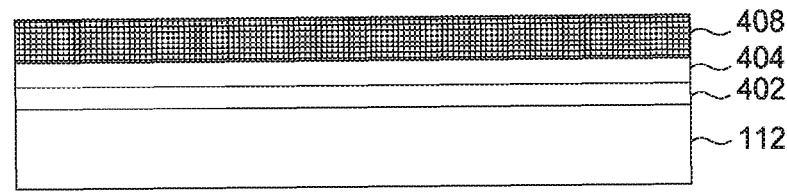

The method 300 begins at 302 by forming a film, which includes a nitride layer 402, an oxide layer 404 and an amorphous silicon layer 406. As shown in FIG. 4A, the nitride layer 402 is deposited over the substrate 112. In one embodiment, the nitride layer 402 may be deposited on and in contact with the substrate 112. The oxide layer 404 is deposited over the nitride layer 402. In one embodiment, the oxide layer 404 may be deposited on and in contact with the nitride layer 402. The amorphous silicon layer 406 is deposited over the oxide layer 404. In one embodiment, the amorphous silicon layer 406 may be deposited on and in contact with the oxide layer 404.

At 304, the amorphous silicon layer 406 is annealed. In one embodiment, the amorphous silicon layer 406 is annealed using excimer laser anneal (ELA) or by solid state annealing. The annealing process transforms the amorphous silicon layer 406 into a polycrystalline silicon layer 408. A polycrystalline silicon layer 408 can also deposited using metal induced crystallization of amorphous silicon.

Figure 4C:
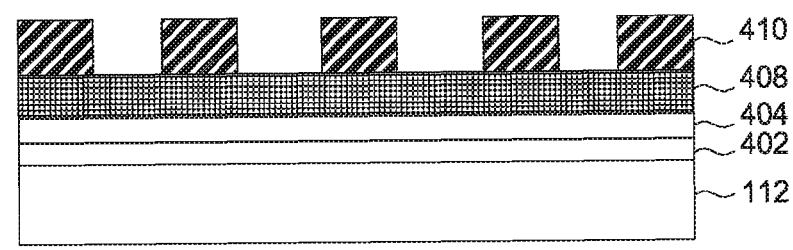

At 306, a mask is deposited over a first portion of the film. As shown in FIG. 4C, the masking layer 410 is deposited over the polycrystalline silicon layer 408. In one embodiment, the masking layer 410 is deposited on and in contact with the polycrystalline silicon layer 408. In one embodiment, the masking layer 410 is a hard mask. In another embodiment, the masking layer 410 is a photoresist layer.

Figure 4D:
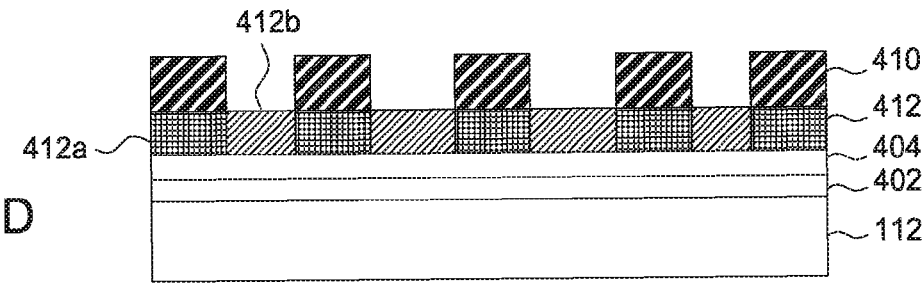

At 308, a second portion of the film is implanted with an amorphizing species. As shown in FIG. 4C, the masking layer 410 is used to cover portions of the polycrystalline silicon layer 408 that are not desired to be further processed. However, portions of the polycrystalline silicon layer 408 are left exposed. The exposed portions of the polycrystalline silicon layer 408 are implanted with an amorphzing species, transforming those portions of the film into an amorphous silicon as shown in FIG. 4D. In one embodiment, the amorphizing species is argon. In another embodiment, the amorphizing species is xenon. In yet another embodiment, the amorphizing species is an inert gas. In yet another embodiment, the amorphizing species is a mixture of inert gases. After amorphizing species have been implanted in the exposed portions of the polycrystalline silicon layer 408, the polycrystalline silicon portions and the amorphized portions are collectively a third layer 412. The third layer 412 comprises at least a first portion 412a that is polycrystalline silicon and a second portion 412b that is amorphized. The second portion 412b may comprise amorphous silicon, microcrystalline silicon or a lower crystalline content polycrystalline silicon. The first portion 412a has a first size and the second portion 412b has a second size. In one embodiment, the first and second sizes are equal. In another embodiment, the first and second sizes are different.

Figure 4E:
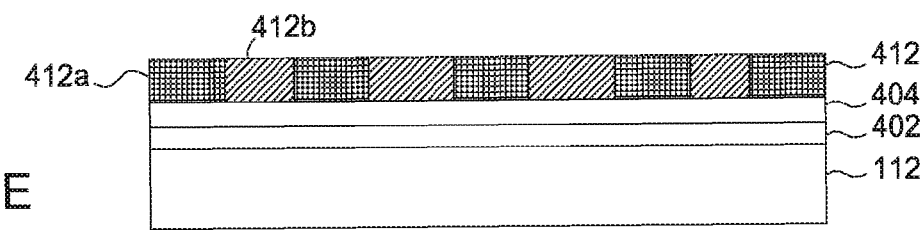

At 310, the masking layer 410 is removed. As shown in FIG. 4E, after the masking layer 410 has been removed, the third layer 412 containing at least a first portion 412a and a second portion 412b remains. After removal of the masking layer, the third layer 412 may be cleaned and further processing steps may be performed so as to complete the TFT structures.

Figure 5:
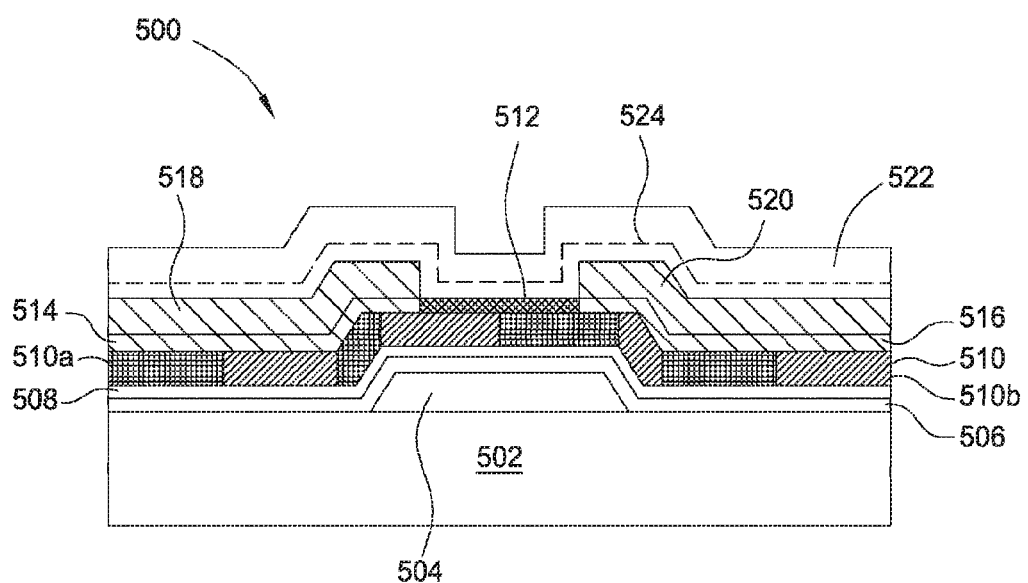
FIG. 5 is a sectional view of a large area substrate thin film transistor device structure according to one embodiment described herein.

FIG. 5 is a sectional view of a large area substrate thin film transistor device 500 structure according to one embodiment described herein. The device 500 includes a substrate 502. The substrate 502 may comprise glass or other suitable substrate materials such as polymer materials or flexible materials. A gate electrode 504 is formed over the substrate 502. Suitable materials that may be used for the gate electrode 504 include chromium, molybdenum, copper, titanium, tungsten and any suitable conductive material. A nitride layer 506 is formed over the substrate 502 and gate electrode 504.

In one embodiment, the nitride layer 506 comprises silicon nitride (SiN). An oxide layer 508 is formed over the nitride layer 506. In one embodiment, the oxide layer 508 is deposited on and in contact with the nitride layer 506. In one embodiment, the oxide layer 508 comprises silicon oxide (SiO). In another embodiment, the nitride layer 506 and oxide layer 508 may be made into a single silicon oxynitride (SiON) layer.

The oxide layer 508 and the nitride layer 506 collectively form the gate dielectric layer. In one embodiment, the gate dielectric layer comprises only the oxide layer 508. In another embodiment, the gate dielectric layer comprises only the nitride layer 506. Suitable materials that may be used for the gate dielectric layer include silicon nitride, silicon oxide and silicon oxynitride.

An active channel 510 is formed over the oxide layer 508. The active channel 510 includes a first portion 510a and a second portion 510b. In one embodiment, the first portion 510a is polycrystalline silicon. In one embodiment, the second portion 510b is amorphous silicon. In another embodiment, the second portion 510b is microcrystalline silicon. In yet another embodiment, the second portion 510b is lower crystalline content polycrystalline silicon.

An etch stop layer 512 may be formed over the active channel 510 to protect the active channel 510 during formation of a source electrode 518 and a drain electrode 520. In one embodiment, the etch stop layer 512 may comprise silicon oxynitride. In other embodiments the etch stop layer 512 may comprise silicon nitride or silicon oxide. An additional active layer 514, 516 may be formed prior to the source electrode 518 and the drain electrode 520. The active layer 514, 516 may be a p-type active layer or an n-type active layer.

A passivation layer 522 may be formed over the source electrode 518, the drain electrode 520, and the etch stop layer 512, if present. The passivation layer 522 may comprise silicon oxide, silicon nitride, and silicon oxynitride. In one embodiment, the passivation layer 522 may comprise a single layer. In another embodiment, the passivation layer 522 may comprise a plurality of layers, as shown by dotted line 524.

As noted above, polycrystalline silicon layers in TFTs are beneficial. Polycrystalline silicon has a higher mobility as compared to amorphous silicon. Hence, polycrystalline silicon is of great interest for TFT fabrication. Polycrystalline silicon does have its drawbacks as noted above. Amorphous silicon, while having a lower mobility, is more reliable in terms of leakage current. By having a semiconductor layer that is a combination of both polycrystalline silicon and amorphous silicon (or microcrystalline silicon or lower crystalline content polycrystalline silicon), a TFT can be manufactured that has both high mobility and less current leakage.

In conclusion, amorphous and LTPS transistors are formed by adding a patterned amorphizing implant prior to the transistor formation post excimer laser anneal to form the amorphous silicon transistor. This combination of both amorphous and LTPS transistors results in an improved large area substrate thin film transistor device, which has good switching properties and does not suffer from leaking or the floating body effect.

While the foregoing is directed to embodiments of the present disclosure, other and further embodiments of the disclosure may be devised without departing from the basic scope thereof, and the scope thereof is determined by the claims that follow.

What is claimed is:

1. A method of forming a thin film transistor on a large area substrate, comprising:
   forming a film, comprising:
      a nitride layer;
      an oxide layer; and
      an amorphous silicon layer;
   annealing the amorphous silicon layer to transform the amorphous silicon layer into a polycrystalline silicon layer;
   depositing a masking layer over a first portion of the polycrystalline silicon layer;
   implanting a second portion of the polycrystalline silicon layer with an amorphizing species to transform the second portion of the polycrystalline silicon layer into an amorphous silicon portion; and
   removing the masking layer.

2. The method of claim 1, wherein annealing the amorphous silicon layer is done by excimer laser anneal or solid state annealing.

3. The method of claim 1, wherein the masking layer is a hard mask.

4. The method of claim 1, wherein the masking layer is a photoresist layer.

5. The method of claim 1, wherein the amorphizing species is an inert gas or a mixture of inert gases.

6. The method of claim 1, wherein the amorphizing species is argon.

7. The method of claim 1, wherein the amorphizing species is xenon.

8. A method of forming a thin film transistor on a large area substrate, comprising:
   forming a polycrystalline silicon layer, comprising:
      depositing an amorphous silicon layer over a substrate; and
      annealing the amorphous silicon layer to transform the amorphous silicon layer into the polycrystalline silicon layer;
   depositing a masking layer, wherein a first portion of the polycrystalline silicon layer is covered by the masking layer and a second portion of the polycrystalline silicon layer is exposed;
   implanting the second portion of the polycrystalline silicon layer with an amorphizing species to transform the second portion of the polycrystalline silicon layer into an amorphous silicon portion; and
   removing the masking layer.

9. The method of claim 8, wherein the annealing the amorphous silicon layer is done by excimer laser anneal.

10. The method of claim 8, wherein the masking layer is a hard mask.

11. The method of claim 8, wherein the masking layer is a photoresist layer.

12. The method of claim 8, wherein the amorphizing species is an inert gas or a mixture of inert gases.

13. The method of claim 8, wherein the amorphizing species is argon.

14. The method of claim 8, wherein the amorphizing species is xenon.

15. A large area substrate thin film transistor device, comprising:
- a first nitride layer;
- a second oxide layer; and
- a third layer, wherein the third layer comprises a first portion and a second portion, and wherein the first portion comprises a polycrystalline silicon and the second portion comprises an amorphous silicon.

16. The device of claim 15, wherein the first portion of the third layer is a low temperature polysilicon transistor.

17. The device of claim 16, wherein the second portion of the third layer is an amorphous transistor.

18. The device of claim 17, wherein the first portion of the third layer has a first size and the second portion of the third layer has a second size, and wherein the first and second sizes are equal.

19. The device of claim 15, wherein the first portion of the third layer has a first size and the second portion of the third layer has a second size, and wherein the first and second sizes are equal.

20. The device of claim 15, wherein the first portion of the third layer has a first size and the second portion of the third layer has a second size, and wherein the first and second sizes are different.

* * * * *